United States Patent
Kang et al.

(10) Patent No.: US 7,675,601 B2
(45) Date of Patent: Mar. 9, 2010

(54) ANISOTROPIC CONDUCTIVE FLAME AND FLAT PANEL DISPLAY USING THE SAME, AND METHOD FOR MANUFACTURING THE SAME

(75) Inventors: Ho Min Kang, Suwon (KR); Hee Young Park, Suwon (KR); Jong Sig Hyun, Suwon (KR); Yun Hee Kim, Hwaseong (KR)

(73) Assignee: Samsung Electronics Co., Ltd. (KR)

( * ) Notice: Subject to any disclaimer, the term of this patent is extended or adjusted under 35 U.S.C. 154(b) by 463 days.

(21) Appl. No.: 11/407,669

(22) Filed: Apr. 20, 2006

(65) Prior Publication Data

US 2007/0052903 A1    Mar. 8, 2007

(30) Foreign Application Priority Data

Sep. 5, 2005    (KR) .................. 10-2005-0082295

(51) Int. Cl.
*G02F 1/1345* (2006.01)
*H01L 23/48* (2006.01)

(52) U.S. Cl. ...................... 349/150; 257/773
(58) Field of Classification Search ............ 349/122, 349/149–152; 257/772–773
See application file for complete search history.

(56) References Cited

U.S. PATENT DOCUMENTS

| 5,223,965 | A * | 6/1993 | Ota et al. ............. 349/150 |
| 7,081,675 | B2 * | 7/2006 | Yim et al. ............ 257/753 |
| 7,139,060 | B2 * | 11/2006 | Cheng et al. ......... 349/150 |
| 7,459,789 | B2 * | 12/2008 | Kim et al. ........... 257/773 |
| 2005/0183884 | A1 | 8/2005 | Su |

OTHER PUBLICATIONS

Chinese Office Action dated May 8, 2009; Chinese patent application No. 200610084820.9.

* cited by examiner

*Primary Examiner*—Dung T. Nguyen
(74) *Attorney, Agent, or Firm*—Cantor Colburn LLP

(57) ABSTRACT

The present invention relates to an anisotropic conductive film with two or more adhesive resins simultaneously formed thereon, such that the two or more adhesive resins are simultaneously formed on a substrate of a flat panel display so as to connect various kinds of devices and flexible circuit boards thereto, thereby reducing the size of a non-display region of the substrate and reducing the number of steps of a manufacturing process. Moreover, with the use of an anisotropic conductive film with two layers of adhesive resins with different conductive particles, an excellent bonding force thereof enables a device or flexible circuit board to be stably mounted on a narrow area.

21 Claims, 10 Drawing Sheets

ANISOTROPIC CONDUCTIVE FLAME AND FLAT PANEL DISPLAY USING THE SAME, AND METHOD FOR MANUFACTURING THE SAME

This application claims priority to Korean Patent Application No. 10-2005-0082295, filed on Sep. 5, 2005 and all the benefits accruing therefrom under 35 U.S.C. §119, and the contents of which in its entirety are herein incorporated by reference.

BACKGROUND OF THE INVENTION

1. Field of the Invention

The present invention relates to an anisotropic conductive film and a flat panel display using the same, and a method for manufacturing the same. More particularly, the present invention relates to an anisotropic conductive film with two or more adhesive resins simultaneously formed thereon, a flat panel display using the anisotropic conductive film, and a method for manufacturing the anisotropic conductive film and the flat panel display.

2. Description of the Related Art

Recently, with the development of portable apparatuses such as cellular phones, personal digital assistants ("PDAs"), portable multimedia players ("PMPs") and MP3 players, techniques for reducing the weight, thickness, size and the like of such portable apparatuses have been actively developed.

In such portable apparatuses, one of the elements occupying a large area of the portable apparatus is a display. Among various kinds of displays, a liquid crystal display ("LCD") includes a first substrate formed with pixel electrodes and thin film transistors ("TFTs"), and a second substrate formed with color filters and transparent electrodes. Each of the substrates has a display region for performing display functions thereon and a non-display region. One of the recent critical issues involving such displays is to reduce the area of the non-display region.

Flexible circuit boards and devices for driving the display are mounted on the non-display region. The devices for driving the display and the flexible circuit board are mounted after an adhesive resin containing conductive particles is first formed on the non-display region.

An adhesive resin containing conductive particles is formed on the non-display region by using an anisotropic conductive film. The anisotropic conductive film is manufactured by evenly mixing the adhesive resin with the conductive particles at a predetermined ratio, applying the mixture of the adhesive resin and the conductive particles to a base film by using rollers, and slitting and rolling the base film into reels.

In order to manufacture a flat panel display, a first substrate formed with pixel electrodes and a second substrate formed with color filters and transparent electrodes are bonded to each other. Then, after forming the adhesive resin containing the conductive particles on a portion of a non-display region of the first substrate, devices for driving the display are fixed on the adhesive resin through heating and pressing. Next, after forming the adhesive resin containing the conductive particles on another portion of the non-display region of the first substrate, a flexible circuit board is fixed on the adhesive resin through heating and pressing.

Since the adhesive resin for use in mounting the device and the adhesive resin for use in mounting the flexible circuit board are separately formed in the flat panel display manufactured by the aforementioned method, there is a problem in that a wide gap exists between the device for driving the display and flexible circuit board, resulting in an increase in the size of the non-display region of the substrate.

Further, since the adhesive resin is formed twice on the non-display region of the first substrate, the manufacturing process is complicated and production costs increase.

BRIEF SUMMARY OF THE INVENTION

Accordingly, the present invention solves the aforementioned problems by providing an anisotropic conductive film with two or more adhesive resins simultaneously formed thereon, and a method for manufacturing a flat panel display, wherein two or more adhesive resins are simultaneously formed on a substrate to connect various kinds of devices and a flexible circuit board to the substrate, thereby reducing the size of the substrate and the number of steps of a manufacturing process.

According to exemplary embodiments of the present invention, a method for manufacturing an anisotropic conductive film includes preparing a base film and simultaneously forming first and second adhesive resins on the base film, at least one of the first and second adhesive resins containing conductive particles.

Simultaneously forming the first and second adhesive resins may include using a roller for moving the base film in one direction, and using nozzles for applying the first and second adhesive resin on the base film.

The roller may be provided with partitions for forming the first and second adhesive resins such that they are separated from each other on the base film.

The base film may be a second base film, and simultaneously forming the first and second adhesive resins on the second base film may include forming the first adhesive resin on a first base film, forming the second adhesive resin on the second base film, applying the first adhesive resin to the second adhesive resin, using a roller for moving the first and second base films in one direction, and removing the first base film.

The method may further include providing the second adhesive resin with a lower density of conductive particles than the first adhesive resin.

Simultaneously forming the first and second adhesive resins on the base film may include placing a third adhesive resin between the base film and the first and second adhesive resins, and the third adhesive resin is mixed with the first and second adhesive resins at interfaces between the third adhesive resin and the first and second adhesive resins, respectively.

The method may further include providing the third adhesive resin with a density of conductive particles lower than a density of the conductive particles contained in the first and second adhesive resins.

The first and second adhesive resins may be formed integrally with each other.

A width of the first adhesive resin formed on the base film may be different from a width of the second adhesive resin formed on the base film.

The density of the conductive particles contained in the first adhesive resin may be different from the density of the conductive particles contained in the second adhesive resin.

The first and second adhesive resins may be formed in an alternate manner, that is, forming first and second adhesive resins on the base film may include forming a plurality of strips of the first and second adhesive resins on the base film and alternately arranging the first and second adhesive resins on the base film.

The method may further include slitting the base film and forming a plurality of anisotropic conductive films, wherein each anisotropic conductive film obtained through the slitting includes the first and second adhesive resins.

Slitting the base film may include using a slitting wheel formed with protrusions, and forming the base film with holes corresponding to the protrusions.

According to other exemplary embodiments of the present invention, an anisotropic conductive film includes a base film, and first and second adhesive resins formed on the base film, at least one of the first and second adhesive resins containing conductive particles. At this time, the first and second adhesive resins are simultaneously formed on the base film.

The adhesive resins may have densities of the conductive particles differently distributed according to heights of the adhesive resins with respect to the base film.

The first and second adhesive resins may be formed integrally with each other.

The second adhesive resin may be formed between the first adhesive resin and the base film.

The first adhesive resin may have a greater density of conductive particles than the second adhesive resin, and the second adhesive resin may have substantially no conductive particles.

The width of the first adhesive resin formed on the base film may be different from the width of the second adhesive resin formed on the base film.

The first adhesive resin formed on the base film may be spaced by a gap from the second adhesive resin formed on the base film.

The density of the conductive particles contained in the first adhesive resin may be different from the density of the conductive particles contained in the second adhesive resin.

According to other exemplary embodiments of the present invention, a method for manufacturing a flat panel display having a device and a flexible circuit board mounted on a substrate, the substrate formed with a display region and a non-display region, includes preparing a base film, simultaneously forming a first adhesive resin and a second adhesive resin on the base film, wherein at least one of the first and second adhesive resins contain conductive particles, forming the first and second adhesive resins on the non-display region of the substrate by using the base film, and mounting the device and the flexible circuit board onto the substrate by using the first and second adhesive resins, respectively, formed on the substrate.

Mounting the device and the flexible circuit board onto the substrate may include electrically connecting the device and the flexible circuit board to the display region of the substrate.

The first and second adhesive resins may have densities of the conductive particles differently distributed according to heights of the first and second adhesive resins with respect to the base film.

The first and second adhesive resins may be formed integrally with each other.

The first and second adhesive resins may be formed of an identical material.

The width of the first adhesive resin formed on the substrate may be different from the width of the second adhesive resin formed on the substrate.

The density of the conductive particles contained in the first adhesive resin may be different from the density of the conductive particles contained in the second adhesive resin.

The first and second adhesive resins may be formed simultaneously on the non-display region of the substrate.

According to still further exemplary embodiments of the present invention, a flat panel display includes a substrate formed with a display region and a non-display region, a first adhesive resin and a second adhesive resin, wherein the first and second adhesive resins contain conductive particles covered with an insulating material and formed on the non-display region of the substrate, and the device and the flexible circuit board mounted on the substrate via the adhesive resins. At this time, the first and second adhesive resins are formed on the substrate using a base film with the first and second adhesive resins simultaneously formed on the base film.

The device and the flexible circuit board may be electrically connected to the display region of the substrate.

The device may be connected to the substrate via the first adhesive resin, and the flexible circuit board may be connected to the substrate via the second adhesive resin. The first and second adhesive resins may be formed simultaneously on the substrate.

The adhesive resins may have densities of the conductive particles differently distributed according to heights of the adhesive resins with respect to the substrate.

The first and second adhesive resins may be formed integrally with each other.

The first adhesive resin may be positioned between the substrate and the second adhesive resin.

The first adhesive resin may have a greater density of conductive particles than the second adhesive resin.

The first and second adhesive resins may be formed of an identical material.

The width of the first adhesive resin formed on the substrate may be different from the width of the second adhesive resin formed on the substrate.

The density of the conductive particles contained in the first adhesive resin may be different from the density of the conductive particles contained in the second adhesive resin.

The first adhesive resin formed on the substrate may be spaced from the second adhesive resin formed on the substrate.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE INVENTION

Figure 1A:
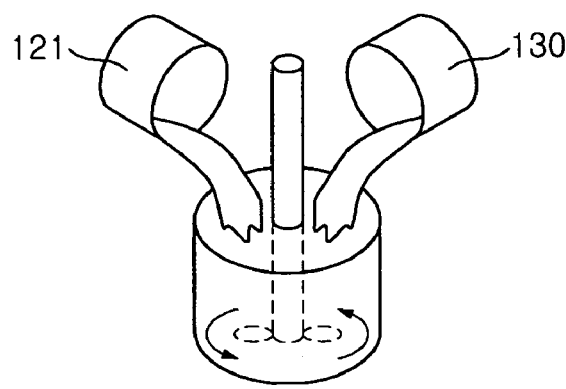
FIGS. 1A to 1D are views illustrating an exemplary method for manufacturing a first exemplary embodiment of an anisotropic conductive film according to the present invention.
Figure 1A:
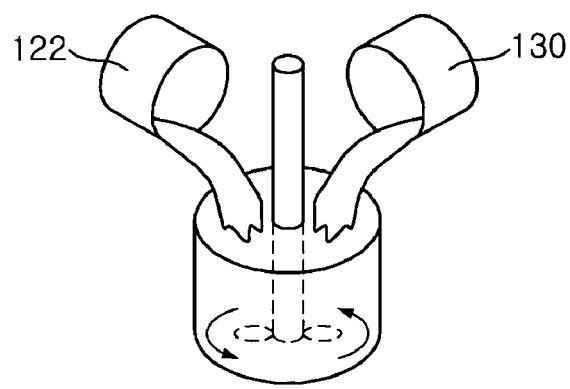

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 1B:
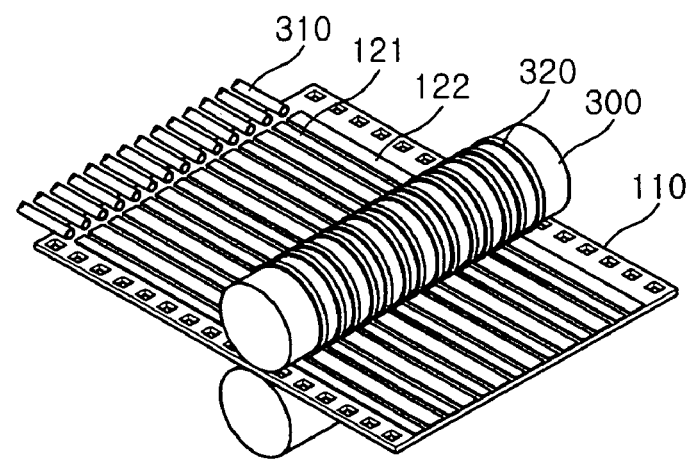
Figure 1C:
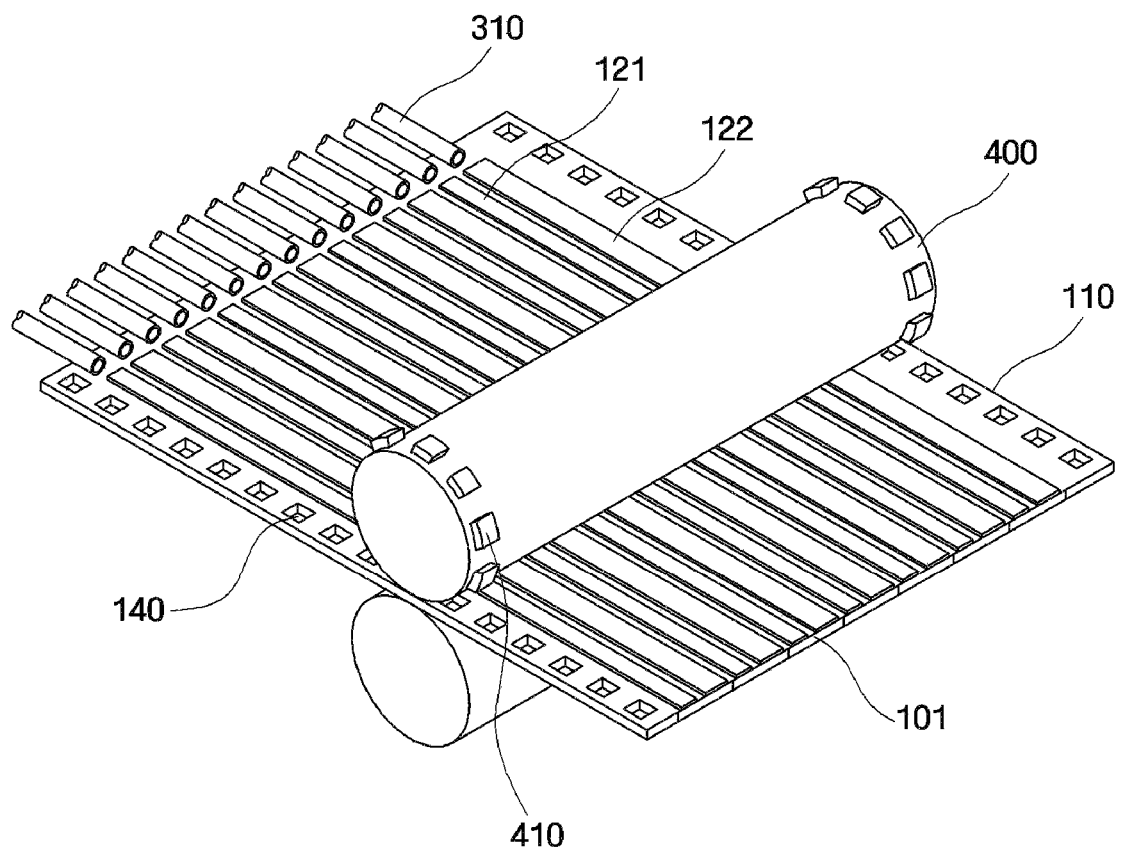
Figure 1D:
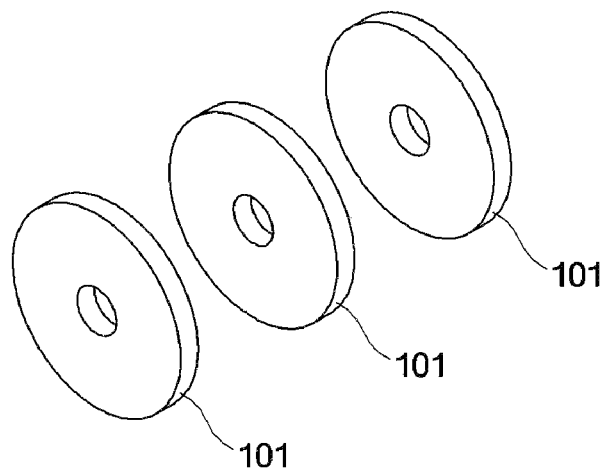
Figure 2:
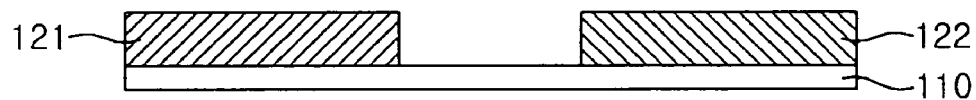
FIG. 2 is a sectional view showing the first exemplary embodiment of the anisotropic conductive film according to the present invention.

FIGS. 1A to 1D are views sequentially illustrating an exemplary method for manufacturing a first exemplary embodiment of an anisotropic conductive film according to the present invention, and FIG. 2 is a sectional view showing the first exemplary embodiment of the anisotropic conductive film according to the present invention.

First, in FIG. 1A, conductive particles 130 are added to and evenly mixed with a first adhesive resin 121 at a predetermined ratio. Also, conductive particles 130 are added to and evenly mixed with a second adhesive resin 122 at a predetermined ratio. The first and second adhesive resins 121 and 122 may have the same or different bonding force(s), and the respective ratios of mixing the conductive particles 130 therewith may be the same as or different from each other. That is, the bonding forces and the ratios of the conductive particles 130 of the adhesive resins 121 and 122 are determined according to their uses.

For example, if the adhesive resins 121 and 122 are used to bond devices formed with bumps, the density of the conductive particles 130 should be increased. Further, if the resins are used to bond a flexible circuit board, a certain material should be additionally added to and mixed with the adhesive resins to improve a bonding force between the flexible circuit board and a substrate, since it is difficult to bond the flexible circuit board using a general adhesive resin due to physical properties of the flexible circuit board.

In FIG. 1B, the first and second adhesive resins 121 and 122 are simultaneously applied to a base film 110 using a roller 300 while the base film 110 is moved in one direction. The first and second adhesive resins 121 and 122 may be applied to the base film 110 using nozzles 310 for discharging predetermined amounts of the first and second adhesive resins 121 and 122 onto the base film 110.

The plurality of nozzles 310 are arranged on the single base film 110 to alternately discharge the first and second adhesive resins 121 and 122, such that the first and second adhesive resins 121 and 122 are alternately arranged on the base film 110. Moreover, the roller 300 may be provided with partitions 320 to prevent the first and second adhesive resins 121 and 122 from being mixed with each other while passing by the roller 300. In this case, a first adhesive resin 121 and a second adhesive resin 122 are formed at the same level. That is, one distance between the first adhesive resin 121 and the base film, and the other distance between the second adhesive resin 122 and the base film, are the same.

Further, the width of the nozzles 310 for discharging the first adhesive resin 121 may be different from the width of the nozzles 310 for discharging the second adhesive resin 122, so that the widths of the first and second adhesive resins 121 and 122 formed on the base film 110 can vary according to uses of the respective adhesive resins. Alternatively, the widths of the nozzles 310 for discharging the first and second adhesive resins 121 and 122 may be the same.

With the nozzles 310 and the partitions 320, slits with certain widths are formed between the first and second adhesive resins 121 and 122. The slits prevent the first and second adhesive resins 121 and 122 from being mixed with each other. That is, the first and second adhesive resins 121 and 122 are spaced from each other by gaps having a predetermined width defining the spacing between adjacent strips of first and second adhesive resins 121 and 122. A gap between a first pair of first and second adhesive resins 121 and 122 and an adjacent second pair of first and second adhesive resins 121 and 122 may have a different width than a gap between the first and second adhesive resins of a same pair.

It is preferred that the slits or gaps have widths much smaller than widths of the first and second adhesive resins 121 and 122 disposed on the base film 110.

In FIG. 1C, the base film 110 on which lines or strips of the first and second adhesive resins 121 and 122 have been alternately formed is slit using a slitting wheel 400. The slitting is performed in a direction in which the lines of the formed adhesive resins extend and such that a single line of the first adhesive resin 121 and a single line of the second adhesive resin 122 are included in a pair.

It is necessary to accurately perform the slitting at the center of each of the narrow slits between each of the adjacent pairs. Therefore, it is preferred that the base film 110 be formed with holes 140 disposed along opposite sides of the base film 110 and the slitting wheel 400 be formed with protrusions 410, disposed about an outer periphery of the slitting wheel 400 and adjacent first and second ends of the slitting wheel 400, where the protrusions 410 correspond to the holes 140 during a rolling motion of the slitting wheel 400 so that the slitting can be performed under accurate alignment. After the slitting process, anisotropic conductive films 101 are formed each containing a base film 110 supporting a strip of the first adhesive resin 121 and a strip of the second adhesive resin 122 spaced from the first adhesive resin 121 by a predetermined gap.

In FIG. 1D, anisotropic conductive films 101 with the first and second adhesive resins 121 and 122 formed thereon are finally rolled into reels for later use, such as in manufacturing processes of display panels.

Thus, the first and second adhesive resins 121 and 122 formed on the base film 110 are prevented from being mixed with each other by using the nozzles 310 and the partitions 320. Alternatively, an anisotropic conductive film formed with the first adhesive resin 121 and another anisotropic conductive film formed with the second adhesive resin 122 may be bonded onto the base film 110, thereby preventing the first and second adhesive resins 121 and 122 from being mixed with each other on the base film 110.

In this case, the slits or gaps may not be formed between the first and second adhesive resins 121 and 122. That is, the first and second adhesive resins 121 and 122 may be formed integrally with each other in a continuous manner.

FIG. 2 is a sectional view of the first exemplary embodiment of the anisotropic conductive film according to the present invention. As shown in FIG. 2, the first and second adhesive resins 121 and 122 are formed on the base film 110.

With the use of the anisotropic conductive film 101 on which the first and second adhesive resins 121 and 122 are formed so as not to be mixed with each other as described above, the first and second adhesive resins 121 and 122 can be simultaneously formed on the base film 110 to form the anisotropic conductive film 101. Also, as will be further described below, the first and second adhesive resins 121 and 122 can be simultaneously formed on a substrate of a display panel through a single process even when different materials are bonded onto the substrate. The adhesive resins 121 and 122 in the anisotropic conductive film 101 each have a first surface and an opposite second surface, where the first surface is in contact with the base film 110 and the second surface is exposed prior to use of the anisotropic conductive film 101.

Although FIG. 2 shows that the first and second adhesive resins 121 and 122 are formed to be spaced apart from each other with a slit or gap existing therebetween, the adhesive resins 121 and 122 may come into contact with each other during the process of using the anisotropic conductive film 101.

Figure 3A:
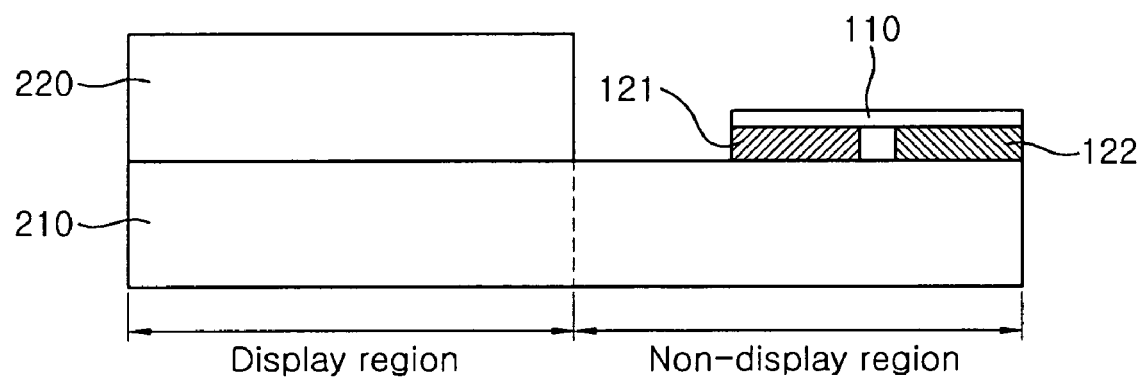
FIGS. 3A to 3C are views illustrating an exemplary method for manufacturing the first exemplary embodiment of a flat panel display according to the present invention.
Figure 3B:
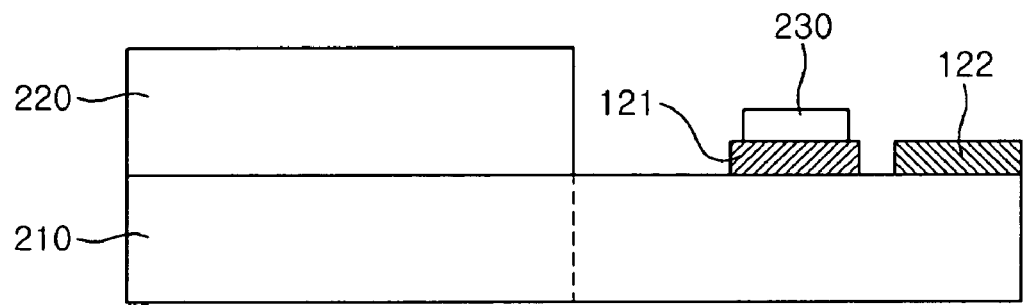
Figure 3C:
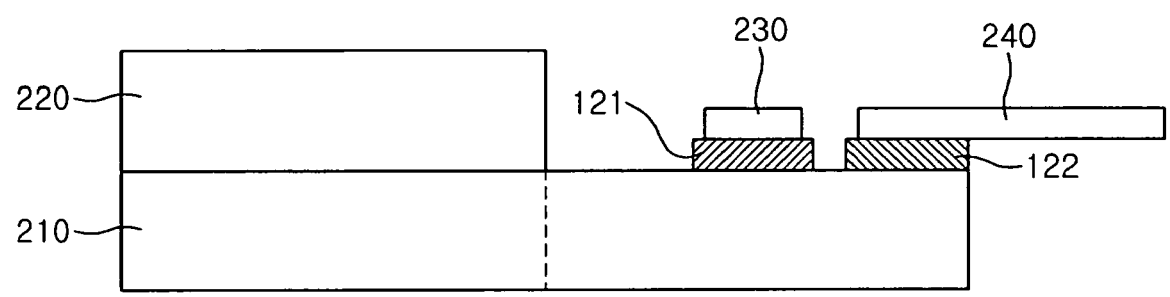
Figure 4:
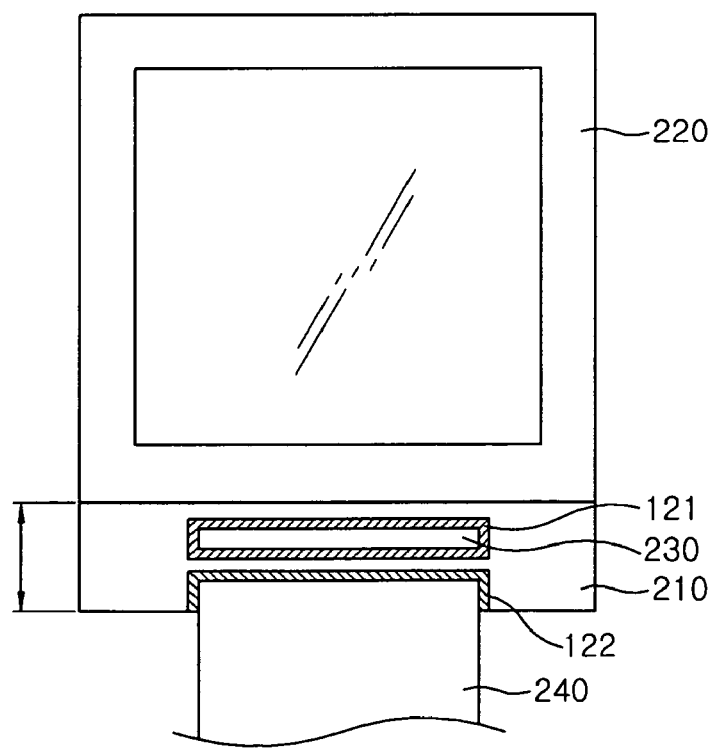
FIG. 4 is a schematic plan view showing the first exemplary embodiment of the flat panel display according to the present invention.

FIGS. 3A to 3C are views sequentially illustrating an exemplary method for manufacturing an exemplary flat panel display using the first exemplary embodiment of the anisotropic conductive film according to the present invention, and FIG. 4 is a plan view of the exemplary finished flat panel display.

First, in FIG. 3A, a first substrate 210 formed with pixel electrodes and a second substrate 220 formed with color filters and transparent electrodes are prepared. The area of each of the first and second substrates 210 and 220 is divided into a display region for performing display thereon and a non-display region. The anisotropic conductive film 101 formed with the first and second adhesive resins 121 and 122 shown in FIG. 2 is formed or otherwise secured on the non-display region of the first substrate 210. That is, the second surfaces of the first and second adhesive resins 121 and 122 are applied to a surface of the non-display region of the first substrate 210. Preferably, an adhesive resin with a higher density of conductive particles 130 is formed on a portion of the non-display region where a device 230 for driving the display is to be placed and an adhesive resin with a lower density of conductive particles 130 is formed on another portion of the non-display region where a flexible circuit board 240 is to be placed, whereby bumps formed on the device 230 are connected to conductive patterns on the substrate 210 through the conductive particles 130 within the adhesive resin having the high density of conductive particles 130 to achieve stable electrical contact.

The adhesive resins 121 and 122 are simultaneously formed onto the first substrate 210 by placing the anisotropic conductive film 101 formed with the first and second adhesive resins 121 and 122 on the non-display region of the first substrate 210, where the first adhesive resin 121 and the second adhesive resin 122 are positioned between the base film 110 and the first substrate 210. Then, the second surfaces of the first and second adhesive resins 121 and 122 are fixed to the first substrate 210 through heating and pressing, and thus removing the base film 110 from the first surfaces of the first and second adhesive resins 121 and 122 for subsequent application of the device 230 and flexible circuit board 240 onto the exposed first surfaces of the first and second adhesive resins 121 and 122.

As shown in FIG. 3B, the device 230 is placed on and fixed to the first surface of the first adhesive resin 121 through heating and pressing. In FIG. 3C, the flexible circuit board 240 is placed on and fixed to the first surface of the second adhesive resin 122 through heating and pressing. That is, the first adhesive resin 121 is used as an adhesive resin for use in mounting the device 230 on the first substrate 210, and the second adhesive resin 122 is used as an adhesive resin for use in mounting the flexible circuit board 240 on the first substrate 210.

The device 230 and the flexible circuit board 240 may be mounted to be electrically connected to the display region of the first substrate 210. Here, the device 230 may be a driving device for driving a pixel electrode formed on the first substrate 210. The first substrate 210 may include gate lines and data lines electrically connected to the pixel electrode via switching devices. The device 230 may thus be electrically connected via the adhesive resin 121 having the conductive particles 130 to the gate lines and/or data lines.

A flat panel display manufactured by such a method has the first and second adhesive resins 121 and 122 simultaneously formed on the first substrate 210. Therefore, as shown in FIG. 4, it is possible to form the first and second adhesive resins 121 and 122 with a very small gap therebetween. Thus, it is possible to reduce the width of the non-display region of the display panel as compared to a conventional flat panel display. Further, since the two adhesive resins 121 and 122 can be formed on the first substrate 210 at substantially the same time, it is possible to reduce the number of steps of a manufacturing process.

Figure 5:
FIG. 5 is a sectional view showing a second exemplary embodiment of an anisotropic conductive film according to the present invention.

FIG. 5 is a sectional view of a second exemplary embodiment of an anisotropic conductive film according to the present invention.

The second exemplary embodiment of the anisotropic conductive film according to the present invention is substantially identical to the first exemplary embodiment except for the formation of a third adhesive resin 125 between the base film 110 and the first and second adhesive resins 121 and 122. That is, first surfaces of the third adhesive resin 125 are applied to the base film 110 and the first surfaces of the first and second adhesive resins 121 and 122 are applied to the second surfaces of the third adhesive resin 125. Thus, descriptions of portions of the second exemplary embodiment that are identical to those of the first exemplary embodiment will be omitted.

The density of conductive particles 130 contained in the third adhesive resin 125 is lower than a density of conductive particles 130 contained in the first and second adhesive resins 121 and 122. Preferably, the third adhesive resin 125 does not contain conductive particles 130. Consequently, the adhesive resins formed as such exhibit different densities of conductive particles according to the heights of the adhesive resins. In other words, the anisotropic conductive film will contain different densities of conductive particles within the adhesive resins therein depending on a location of the adhesive resin within the anisotropic conductive film, where the location is measured in a direction perpendicular to a surface of the base film 110 or a surface of the substrate 210 onto which the anisotropic conductive film is applied.

With the use of the second exemplary embodiment of the anisotropic conductive film according to the present invention, the first and second adhesive resins 121 and 122 with the higher densities of the conductive particles 130 are formed on the first substrate 210, by applying the second surfaces of the first and second adhesive resins 121 and 122 to the surface of the first substrate 210. The second surfaces of the third adhesive resin 125 are formed on the first surfaces of the first and second adhesive resins, and thus the first surfaces of the third adhesive resin 125 is exposed upon removal of the base film 110. Since the third adhesive resin 125 contains little or no conductive particles, it has an excellent bonding force, thereby enabling the device 230 or the flexible circuit board 240 to be stably mounted thereon.

Although FIG. 5 shows that the first and third adhesive resins 121 and 125 are formed to be spaced apart from the second and third adhesive resins 122 and 125 with a slit or gap existing therebetween, the adhesive resins may come into contact with each other during the manufacturing process. Further, when the first and second adhesive resins 121 and 122 are formed on the third adhesive resin 125, the third adhesive resin 125 may be mixed with the first and second adhesive resins 121 and 122 at their respective interfaces.

Figure 6A:
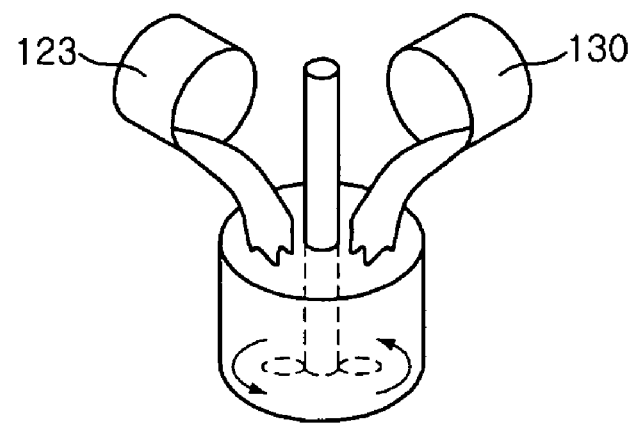
FIGS. 6A to 6E are views illustrating an exemplary method for manufacturing a third exemplary embodiment of an anisotropic conductive film according to the present invention.
Figure 6A:
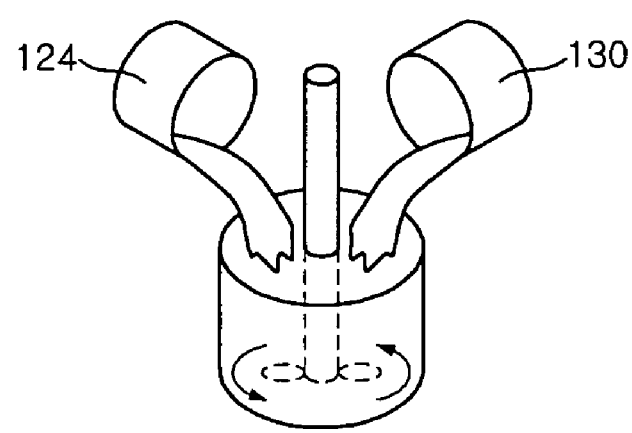
Figure 6B:
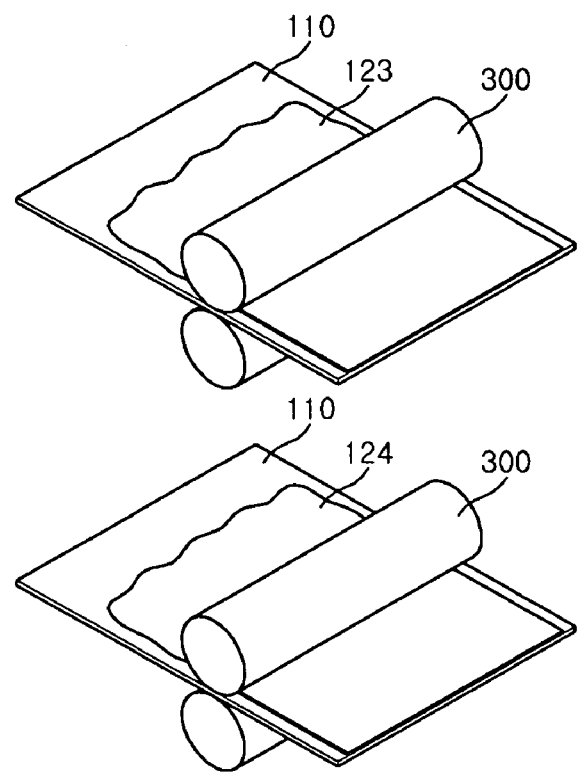
Figure 6C:
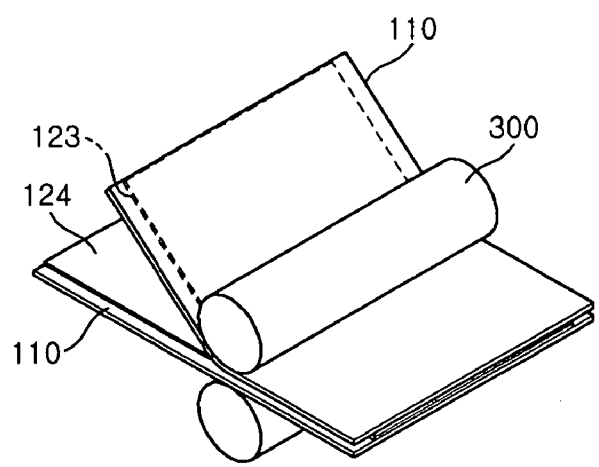
Figure 6D:
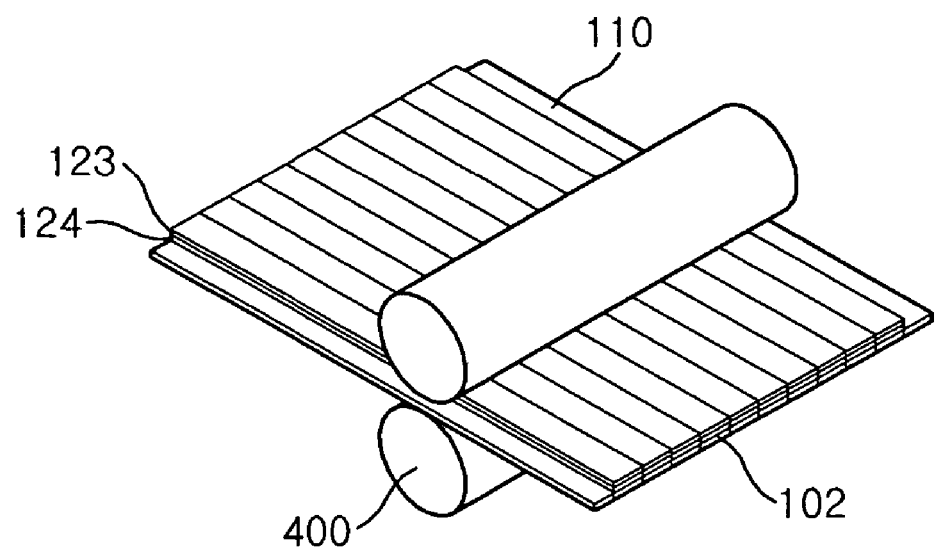
Figure 6E:
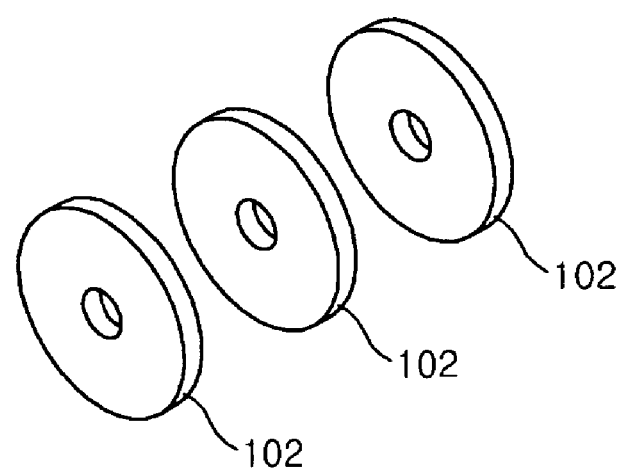
Figure 7:
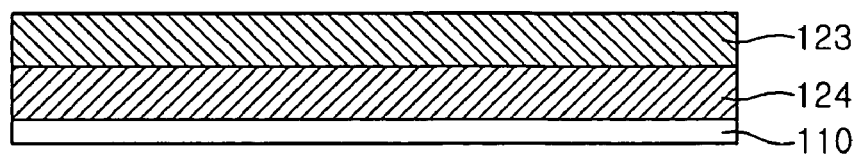
FIG. 7 is a sectional view showing the third exemplary embodiment of the anisotropic conductive film according to the present invention.

FIGS. 6A to 6E are views illustrating an exemplary method for manufacturing a third exemplary embodiment of an anisotropic conductive film according to the present invention, and FIG. 7 is a sectional view showing the third exemplary embodiment of the anisotropic conductive film according to the present invention.

First, in FIG. 6A, conductive particles 130 are added to and evenly mixed with a fourth adhesive resin 123 at a predetermined ratio. Also, conductive particles 130 are added to and evenly mixed with a fifth adhesive resin 124 at a predetermined ratio. The fourth and fifth adhesive resins 123 and 124 have different bonding forces, and the respective ratios of mixing the conductive particles 130 therewith are also different from each other.

In FIG. 6B, while two base films 110 are moved in one direction using a rollers 300, the fourth adhesive resin 123 is applied to a first base film 110 and the fifth adhesive resin 124 is applied to a second base film 110. Thus, a first surface of the fourth adhesive resin 123 is in contact with the first base film 110 and a second surface of the fourth adhesive resin 123 is exposed. Similarly, a first surface of the fifth adhesive resin 124 is in contact with the second base film 110 and a second surface of the fifth adhesive resin 124 is exposed.

In FIG. 6C, the first base film 110 with the fourth adhesive resin 123 applied-thereto and the second base film 110 with the fifth adhesive resin 124 applied thereto are passed through a roller 300 in opposite directions. That is, the second surface of the fourth adhesive resin 123 is laid into contact with the second surface of the fifth adhesive resin 124 such that the first and second base films 110 are in contact with the roller 300 in this portion of the method. Then, one of the first and second base films 110 is removed. In this embodiment of the present invention, the first base film 110 is removed such that the fifth adhesive resin 124 is placed between the base film 110 and the fifth adhesive resin 123.

At this time, it is preferred that the density of the conductive particles 130 contained in the fourth adhesive resin 123 is higher than the density of the conductive particles 130 contained in the fifth adhesive resin 124. Alternatively, the fifth adhesive resin 124 may contain little or no conductive particles 130.

In FIG. 6D, the second base film 110 with the fourth and fifth adhesive resins 123 and 124 formed in two layers is slit using a slitting wheel 400. The slitting wheel 400 may cut strips of the second base film 110 and fourth and fifth adhesive resins 123 and 124 into a variety of sizes or into strips of the same size for forming each anisotropic conductive film 102.

In FIG. 6E, anisotropic conductive films 102 each of which has the fourth and fifth adhesive resins 123 and 124 formed on a second base film 110 are finally rolled into reels.

Referring to FIG. 7, the anisotropic conductive film 102 includes the fourth and fifth adhesive resins 123 and 124 formed in two layers on the second base film 110.

With the use of the third exemplary embodiment of the anisotropic conductive film 102 in which the fourth and fifth adhesive resins 123 and 124 are formed in two layers, the fifth adhesive resin 124 has few or no conductive particles 130 and thus exhibits an excellent bonding force and enables a device 230, a flexible circuit board 240 or the like to be stably and freely mounted on a narrow area.

In FIG. 7, while the fourth adhesive resin 123 is formed on the fifth adhesive resin 124, the fourth and fifth adhesive resins 123 and 124 may be mixed with each other in a certain amount at their interface. That is, an interface defined by the second surface of the fourth adhesive resin 123 laid onto the second surface of the fifth adhesive resin 124 may contain a mixture of the fourth and fifth adhesive resins 123 and 124. Thus, in the anisotropic conductive film 102 shown in FIG. 7, the first surface of the fourth adhesive resin 123 is exposed and the first surface of the fifth adhesive resin 124 is in contact with the second base film 110.

Figure 8A:
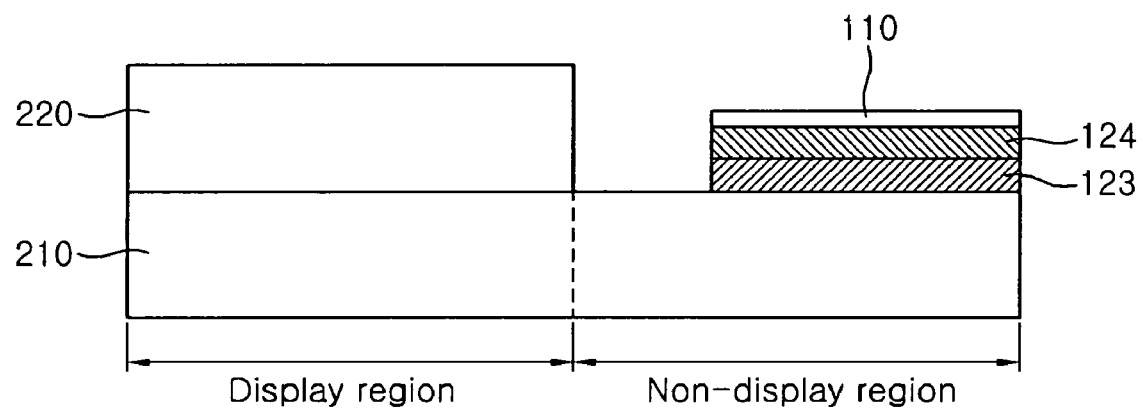
FIGS. 8A to 8C are views illustrating an exemplary method for manufacturing the third exemplary embodiment of a flat panel display according to the present invention.
Figure 8B:
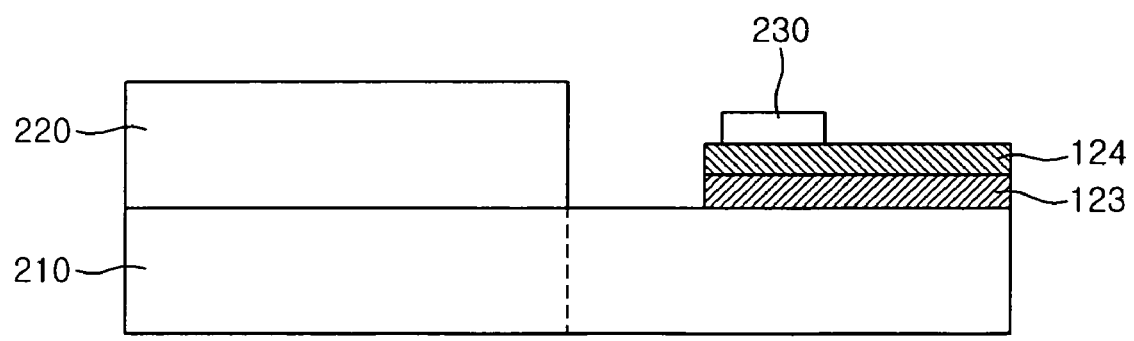
Figure 8C:
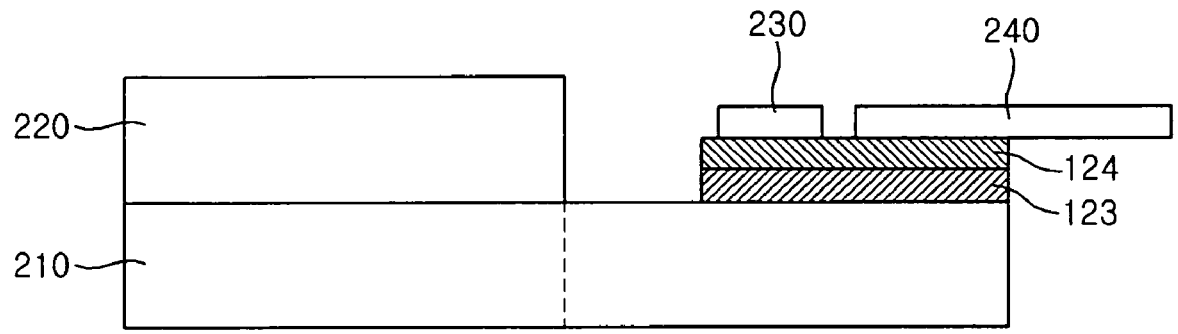

FIGS. 8A to 8C are views sequentially illustrating an exemplary method for manufacturing an exemplary flat panel display using the third exemplary embodiment of the anisotropic conductive film according to the present invention, and FIG. 9 is a sectional view of a portion of the exemplary flat panel display. Further, FIG. 10 is a plan view showing a finished state of the exemplary flat panel display using the third exemplary embodiment of the anisotropic conductive film according to the present invention.

First, in FIG. 8A, a first substrate 210 formed with pixel electrodes and a second substrate 220 formed with color filters and transparent electrodes are prepared. The area of each of the first and second substrates 210 and 220 is divided into a display region for performing display functions thereon and a non-display region. The non-display region may be in a peripheral portion of the first and second substrates 210 and 220 surrounding the display regions thereof. The anisotropic conductive film formed with the two layers of the fourth and fifth adhesive resins 123 and 124 shown in FIG. 7 is formed on the non-display region of the first substrate 210.

The adhesive resins 123 and 124 are formed integrally with portions of the first substrate 210 where a device 230 and a flexible circuit board 240 are to be mounted, respectively. Further, the adhesive resins 123 and 124 are formed by placing the anisotropic conductive film 102, which has the fourth and fifth adhesive resins 123 and 124 formed in the two layers on the second base film 110, on the non-display region of the first substrate 210 and fixing it thereto through heating and pressing. Thus, the first surface of the fourth adhesive resin 123, which contains a greater amount of conductive particles 130, is in contact with the surface of the first substrate 210, and upon removal of the second base film 110, the first surface of the fifth adhesive resin 124, which contains fewer or no conductive particles 130, is exposed.

Then, in FIG. 8B, the device 230 is placed on and fixed to the adhesive resins 123 and 124 through heating and pressing. In FIG. 8C, the flexible circuit board 240 is placed on and fixed to the adhesive resins 123 and 124 through heating and pressing.

The device 230 and the flexible circuit board 240 can be mounted so as to be electrically connected to the display region of the substrate via gates lines and data lines disposed on the first substrate 210, as previously described. Here, the device 230 may be a driving device for driving a pixel electrode formed on the first substrate 210.

At this time, it is preferred that the density of the conductive particles 130 contained in the fourth adhesive resin 123 be larger than the density of the conductive particles 130 contained in the fifth adhesive resin 124. Further, the fifth adhesive resin 124 may contain few or no conductive particles 130.

Figure 9A:
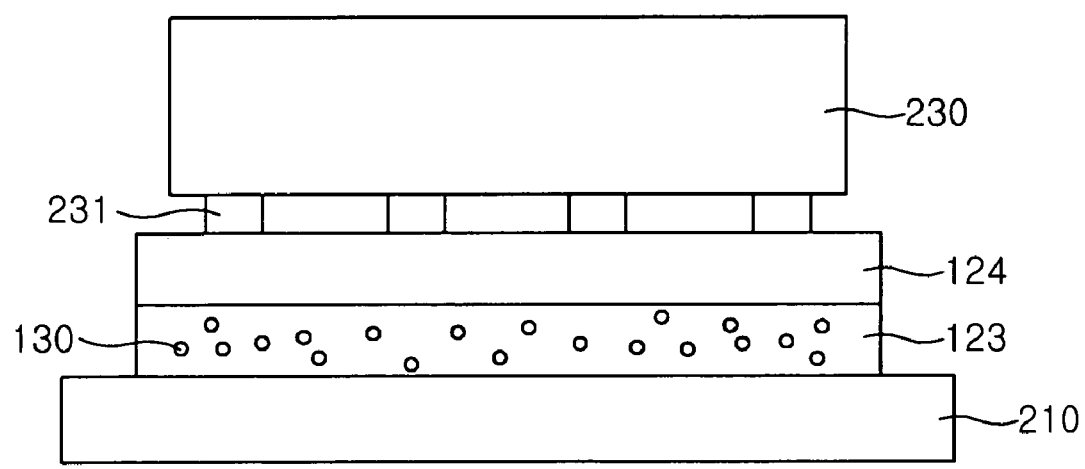
FIGS. 9A to 9B are enlarged views showing a connection portion between a device and a substrate in the exemplary flat panel display of FIGS. 8A to 8C.
Figure 9B:
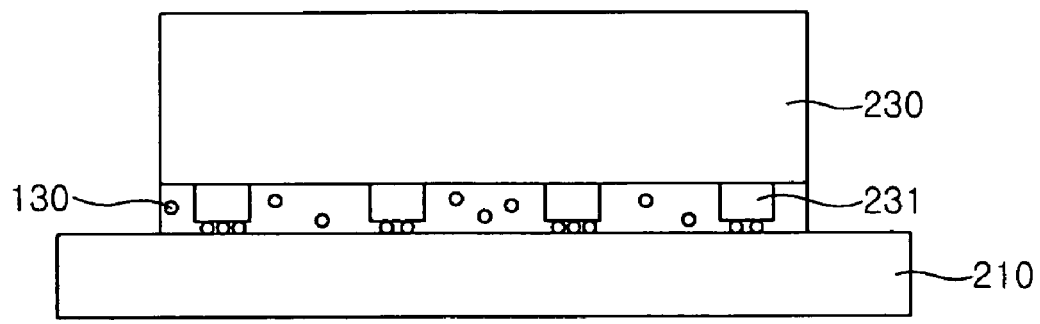
Figure 10:
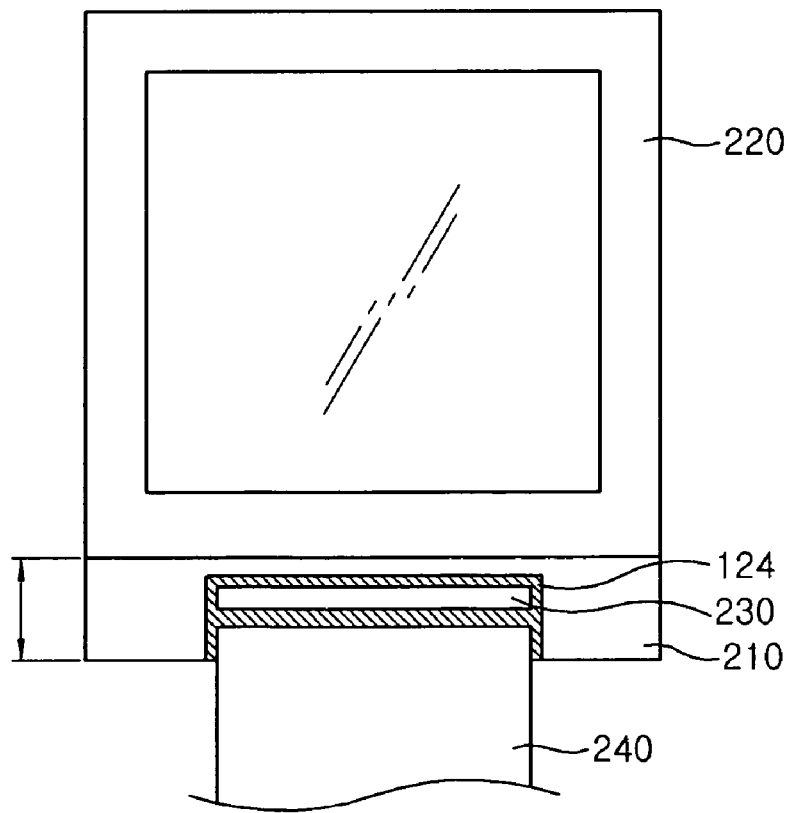
FIG. 10 is a schematic-plan view showing the third exemplary embodiment of the flat panel display according to the present invention.

That is, referring to FIGS. 9A and 9B, the fourth and fifth adhesive resins 123 and 124 are sequentially stacked on the first substrate 210, and the fifth adhesive resin 124, in this example, does not contain conductive particles 130. The device 230 is lowered onto the first surface of the fifth adhesive resin 124 so that bumps 231 placed on the bottom of the device 230 can be electrically connected to electrical lines of the first substrate 210. At this time, due to the presence of the conductive particles 130 between the substrate 210 and the bumps 231, the device 230 and the substrate 210 are electrically connected to each other. Because the fifth adhesive resin 124, placed over the fourth adhesive resin 123, contains a low density of the conductive particles 130 or does not contain any conductive particles 130, regions of the device 230 where the bumps are not formed are sufficiently spaced apart from the conductive particles 130, thereby ensuring insulation.

In the flat panel display manufactured by this method, the adhesive resins 123 and 124 for mounting the device 230 and the flexible circuit board 240 are formed integrally, and are simultaneously applied to the first substrate 210. Therefore, as shown in FIG. 10, the width of the non-display region can be greatly reduced and the number of steps of a manufacturing process can also be reduced.

Although the embodiments of the present invention have been described primarily in connection with a liquid crystal display ("LCD") as an example of flat panel displays, the present invention is not limited to the LCD but may be applied to a variety of flat panel displays, including an organic light emitting display ("OLED") based on a principle (electroluminescence) in which an organic material or conjugated polymer with semiconductor properties is used as a luminous material to be interposed between two electrodes and a voltage is applied thereto so that a current can flow into the luminous material to cause the organic material or polymer to generate light, a plasma display panel ("PDP") in which a plurality of small cells are arranged between two sheets of substrates and gas (neon or argon) discharge is generated between electrodes (positive and negative electrodes) mounted on the tops and bottoms thereof so that self-luminescence can be achieved by ultraviolet rays resulting from the discharge and thus color images can be realized, or the like.

As described above, with the use of an anisotropic conductive film with two or more adhesive resins simultaneously formed thereon according to the present invention, the two or more adhesive resins are simultaneously formed on a substrate so as to connect various kinds of devices and flexible circuit boards thereto, thereby enabling the reduction of the size of a non-display region of the substrate and reducing the number of steps of a manufacturing process.

Moreover, with the use of an anisotropic conductive film with two layers of adhesive resins with different conductive particles according to the present invention, an excellent bonding force thereof enables a device or flexible circuit board to be stably mounted on a narrow area.

The scope of the present invention is not limited to the embodiments described above, and all modifications and changes that those skilled in the art make based on the fundamental concept of the present invention defined by the appended claims will fall within the scope of the present invention.

What is claimed is:

1. A method for manufacturing an anisotropic conductive film, the method comprising:

preparing a base film; and simultaneously forming first and second adhesive resins on the base film, at least one of the first and second adhesive resins containing conductive particles, wherein a first distance between the first adhesive resin and the base film, and a second distance between the second adhesive resin and the base film, are the same.

2. The method as claimed in claim 1, wherein simultaneously forming the first and second adhesive resins includes using a roller moving the base film in one direction, and using nozzles applying the first and second adhesive resins on the base film.

3. The method as claimed in claim 2, wherein using a roller includes providing the roller with partitions for forming the first and second adhesive resins separate from each other on the base film.

4. The method as claimed in claim 1, wherein the base film is a second base film, and simultaneously forming the first and second adhesive resins on the second base film includes forming the first adhesive resin on a first base film, forming the second adhesive resin on the second base film, applying the first adhesive resin to the second adhesive resin, using a roller moving the first and second base films in one direction, and removing the first base film.

5. The method as claimed in claim 4, further comprising providing the second adhesive resin with a lower density of conductive particles than the first adhesive resin.

6. The method as claimed in claim 1, wherein simultaneously forming first and second adhesive resins on the base film comprises placing a third adhesive resin between the base film and the first and second adhesive resins, and the third adhesive resin is mixed with the first and second adhesive resins at interfaces between the third adhesive resin and the first and second adhesive resins, respectively.

7. The method as claimed in claim 6, further comprising providing the third adhesive resin with a density of conductive particles lower than a density of the conductive particles contained in the first and second adhesive resins.

8. The method as claimed in claim 6, wherein the first and second adhesive resins are formed integrally with each other.

9. The method as claimed in claim 1, wherein a width of the first adhesive resin formed on the base film is different from a width of the second adhesive resin formed on the base film.

10. The method as claimed in claim 1, wherein a density of the conductive particles contained in the first adhesive resin is different from a density of the conductive particles contained in the second adhesive resin.

11. The method as claimed in claim 1, wherein forming first and second adhesive resins on the base film includes forming a plurality of strips of the first and second adhesive resins on the base film and alternately arranging the first and second adhesive resins on the base film.

12. The method as claimed in claim 11, further comprising:
slitting the base film and forming a plurality of anisotropic conductive films,
wherein each anisotropic conductive film obtained through the slitting includes the first and second adhesive resins.

13. The method as claimed in claim 12, wherein slitting the base film includes using a slitting wheel formed with protrusions, and forming the base film with holes corresponding to the protrusions.

14. A method for manufacturing a flat panel display having a device and a flexible circuit board mounted on a substrate, the substrate formed with a display region and a non-display region, the method comprising:
preparing a base film,
simultaneously forming a first adhesive resin and a second adhesive resin on the base film, at least one of the first and second adhesive resins containing conductive particles,
forming the first and second adhesive resins on the non-display region of the substrate by using the base film, and
mounting the device and the flexible circuit board onto the substrate by using the first and second adhesive resins, respectively, formed on the substrate,
wherein a first distance between the first adhesive resin and the base film, and a second distance between the second adhesive resin and the base film, are the same.

15. The method as claimed in claim 14, wherein mounting the device and the flexible circuit board onto the substrate includes electrically connecting the device and the flexible circuit board to the display region of the substrate.

16. The method as claimed in claim 14, wherein the first and second adhesive resins have densities of the conductive particles differently distributed according to heights of the first and second adhesive resins with respect to the base film.

17. The method as claimed in claim 16, wherein the first and second adhesive resins are formed integrally with each other.

18. The method as claimed in claim 14, wherein the first and second adhesive resins are formed of an identical material.

19. The method as claimed in claim 14, wherein a width of the first adhesive resin formed on the substrate is different from a width of the second adhesive resin formed on the substrate.

20. The method as claimed in claim 14, wherein a density of the conductive particles contained in the first adhesive resin is different from a density of the conductive particles contained in the second adhesive resin.

21. The method as claimed in claim 14, wherein the first and second adhesive resins are formed simultaneously on the non-display region of the substrate.

* * * * *